United States Patent
Miyairi et al.

(10) Patent No.: US 8,803,422 B2
(45) Date of Patent: Aug. 12, 2014

(54) LIGHT EMITTING DEVICE IN WHICH TRACES OF LIGHT EMITTING ELEMENTS MERGE INTO A SINGLE TRACE AND LIGHTING APPARATUS INCLUDING THE SAME

(71) Applicant: Nichia Corporation, Anan (JP)

(72) Inventors: Hiroshi Miyairi, Yokohama (JP); Eiji Tokunaga, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/665,000

(22) Filed: Oct. 31, 2012

(65) Prior Publication Data

US 2013/0106276 A1 May 2, 2013

(30) Foreign Application Priority Data

| Nov. 1, 2011 | (JP) | 2011-239855 |
| Nov. 29, 2011 | (JP) | 2011-261078 |
| Dec. 7, 2011 | (JP) | 2011-268438 |
| Sep. 8, 2012 | (JP) | 2012-197987 |

(51) Int. Cl.
  *H01L 25/075* (2006.01)
  *H01L 33/50* (2010.01)
  *F21S 8/04* (2006.01)
  *F21Y 105/00* (2006.01)

(52) U.S. Cl.
  CPC .......... *H01L 25/0753* (2013.01); *H01L 33/50* (2013.01); *F21S 8/04* (2013.01); *F21Y 2105/003* (2013.01)
  USPC .................. 313/512; 362/84; 362/249.02

(58) Field of Classification Search
  CPC ....... H01L 25/0753; H01L 33/50; F21S 8/04; F21Y 2105/003
  USPC ............... 257/88, 100; 313/501, 512; 362/84, 362/244–246, 249.02, 249.06, 249.14
  See application file for complete search history.

(56) References Cited

U.S. PATENT DOCUMENTS

| 2003/0095408 A1* | 5/2003 | Opolka ......................... 362/241 |
| 2004/0164308 A1* | 8/2004 | Asatsuma et al. .............. 257/94 |
| 2008/0062682 A1* | 3/2008 | Hoelen et al. ................. 362/231 |
| 2009/0189165 A1* | 7/2009 | Song ............................. 257/88 |
| 2010/0066229 A1* | 3/2010 | Hamby et al. .................... 313/1 |
| 2011/0215349 A1* | 9/2011 | An et al. ......................... 257/89 |

FOREIGN PATENT DOCUMENTS

JP      2005-159262 A      6/2005

* cited by examiner

*Primary Examiner* — Nimeshkumar Patel
*Assistant Examiner* — Steven Horikoshi
(74) *Attorney, Agent, or Firm* — Foley & Lardner LLP

(57) ABSTRACT

A light emitting device comprises a plurality of light emitting elements sealed with a fluorescent material containing member, each of the plurality of light emitting elements having an upper surface. The plurality of light emitting elements are arranged such that, in a planar view of a light emitting surface, when the plurality of light emitting elements are projected in a parallel direction in a plane of the light emitting surface, traces of the upper surfaces of the plurality of the light emitting elements merge into a single trace. A light emitting apparatus comprises a light-concentrating device, and the light emitting device.

22 Claims, 15 Drawing Sheets

(1)

(2)

(3)

(4)

(5)

(6)

(7)

(8)

(9)

(a)

(b)

LIGHT EMITTING DEVICE IN WHICH TRACES OF LIGHT EMITTING ELEMENTS MERGE INTO A SINGLE TRACE AND LIGHTING APPARATUS INCLUDING THE SAME

CROSS-REFERENCE TO RELATED APPLICATIONS

This application claims priority to and the benefit of Japanese Patent Application No. 2011-239855, filed on Nov. 1, 2011; Japanese Patent Application No. 2011-261078, filed on Nov. 29, 2011; Japanese Patent Application No. 2011-268438, filed on Dec. 7, 2011; and Japanese Patent Application No. 2012-197987, filed on Sep. 8, 2012, each of which is hereby incorporated by reference in their entireties.

BACKGROUND

1. Technical Field

The present disclosure relates to a light emitting device used for a lighting apparatus, etc.

2. Discussion of Related Art

There have been proposed lighting apparatuses in which a plurality of groups of light emitting devices with a circular shape or a polygonal shape are arranged concentrically (see, e.g., JP 2005-159262 A).

However, these conventional lighting apparatuses have a problem that when the concentration of light is performed by using a light-concentrating device such as a lens and a reflector, light having deviation in color (i.e., uneven color) is projected on the walls and floors, and thus, high quality lighting cannot be obtained.

SUMMARY

Accordingly, an object of embodiments of the present invention is to provide a light emitting device and a lighting apparatus having excellent lighting quality with the use of a light-concentrating device for condensing light.

According to embodiments of the present invention, the problems described above can be solved by the means described below.

In one embodiment, a light emitting device comprises a plurality of light emitting elements sealed with a fluorescent material containing member, each of the plurality of light emitting elements having an upper surface. The plurality of light emitting elements are arranged such that, in a planar view of a light emitting surface, when the plurality of light emitting elements are projected in a parallel direction in a plane of the light emitting surface, traces of the upper surfaces of the plurality of the light emitting elements merge into a single trace.

In one aspect, the plurality of light emitting elements are arranged such that, in a planar view of the light emitting surface, when the plurality of the light emitting elements are rotated around a center of the light emitting surface, traces of the upper surfaces of the plurality of the light emitting elements merge to form a single circle centered at the center of the light emitting surface.

In one aspect, in a planar view of the light emitting surface, the plurality of the light emitting elements are arranged more densely at a center region of the light emitting surface than at a peripheral region of the light emitting surface.

In one aspect, at least some of the plurality of light emitting elements have upper surfaces of different shapes.

In one aspect, at least some of the plurality of light emitting elements have upper surfaces of different sizes.

In one aspect, the light emitting surface has a circular shape, and at least one of the light emitting elements is arranged at an angle along an edge of the light emitting surface having a circular shape.

In one aspect, the light emitting surface has a quadrangular shape.

In one aspect, the plurality of light emitting elements are arranged in a staggered manner.

In one aspect, the plurality of light emitting elements are arranged in a longitudinally asymmetric manner.

In one aspect, the plurality of light emitting elements are arranged in a laterally asymmetric manner.

In one aspect, the light emitting device further comprises a first recess; and a second recess formed in a bottom surface of the first recess. The plurality of light emitting elements are arranged on a bottom surface of the second recess. A first layer containing light-diffusing material particles seals the first recess. A second layer containing fluorescent material particles seals the second recess.

In one aspect, the first layer substantially does not contain fluorescent material particles.

In one aspect, the fluorescent material particles are contained in the second layer with a downwardly increasing density.

In one aspect, the plurality of light emitting elements are arranged in a scattered manner on the bottom surface of the second recess.

In one aspect, a reflective member is disposed on a side surface of the second recess.

In one aspect, a reflective member is disposed on a side surface of the first recess.

In one aspect, the fluorescent material particles have a particle diameter of 6 µm or greater.

In another embodiment, a lighting apparatus comprises a light-concentrating device; and a light emitting device comprising a plurality of light emitting elements sealed with a fluorescent material containing member, each of the plurality of light emitting elements having an upper surface. The plurality of light emitting elements are arranged such that, in a planar view of a light emitting surface, when the plurality of light emitting elements are projected in a parallel direction in a plane of the light emitting surface, traces of the upper surfaces of the plurality of the light emitting elements merge into a single trace. The light emitting device is attached to the light-concentrating device.

In one aspect, a center of the light emitting surface is coincident with a focal point of the light-concentrating device.

In another embodiment, a light emitting device comprises a plurality of light emitting elements sealed with a fluorescent material containing member, each of the plurality of light emitting elements having an upper surface. The plurality of light emitting elements are arranged such that, in a planar view of a light emitting surface, when the plurality of light emitting elements are projected in a parallel direction in a plane of the light emitting surface, traces of the upper surfaces of the plurality of the light emitting elements merge into a single trace. The plurality of light emitting elements are arranged such that, in a planar view of the light emitting surface, when the plurality of the light emitting elements are rotated around a center of the light emitting surface, traces of the upper surfaces of the plurality of the light emitting elements merge to form a single circle centered at the center of the light emitting surface. In a planar view of the light emitting surface, the plurality of the light emitting elements are arranged more densely at a center region of the light emitting surface than at a peripheral region of the light emitting surface.

According to the present invention, there can be provided a light emitting device and a lighting apparatus having excellent lighting quality with using a light-concentrating device for condensing light.

DETAILED DESCRIPTION OF EMBODIMENTS

Embodiments of the present invention will be described below with reference to the accompanying drawings.

Figure 1:
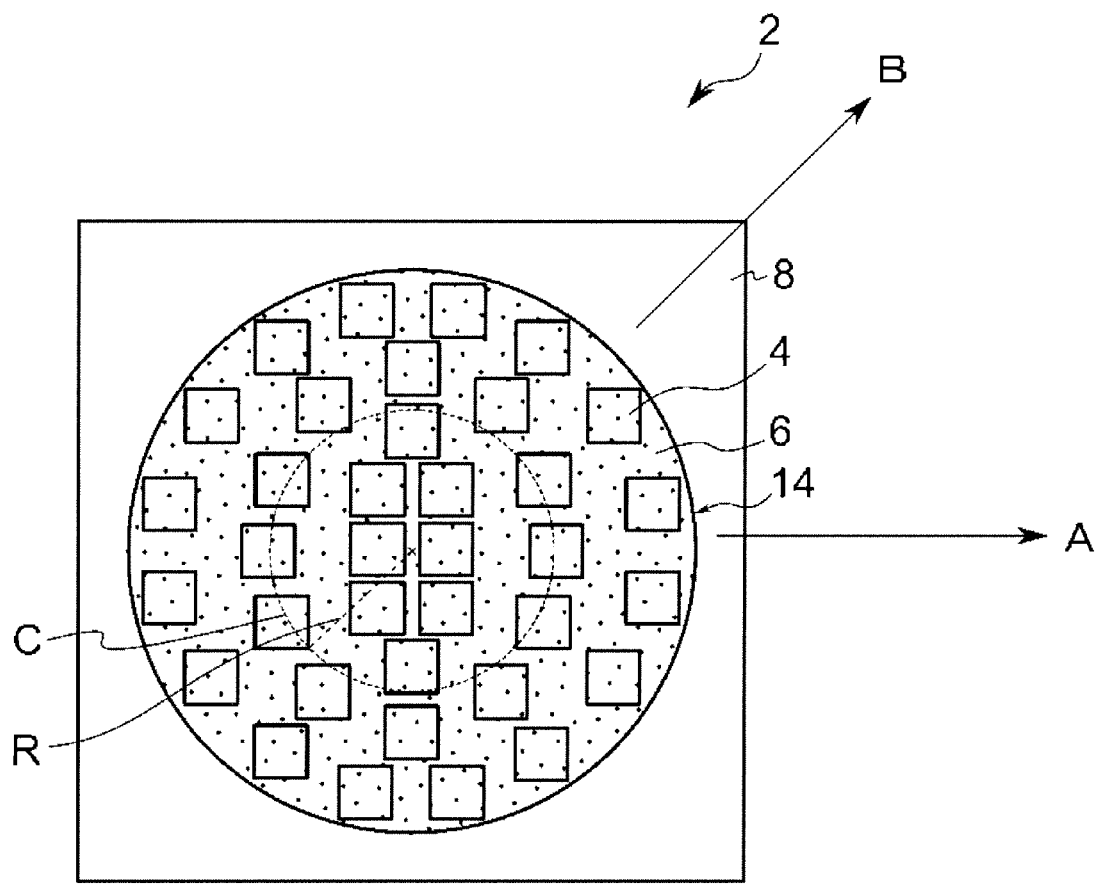
FIG. 1 is a planar view showing a light emitting device according to an embodiment of the present invention.
Figure 2:
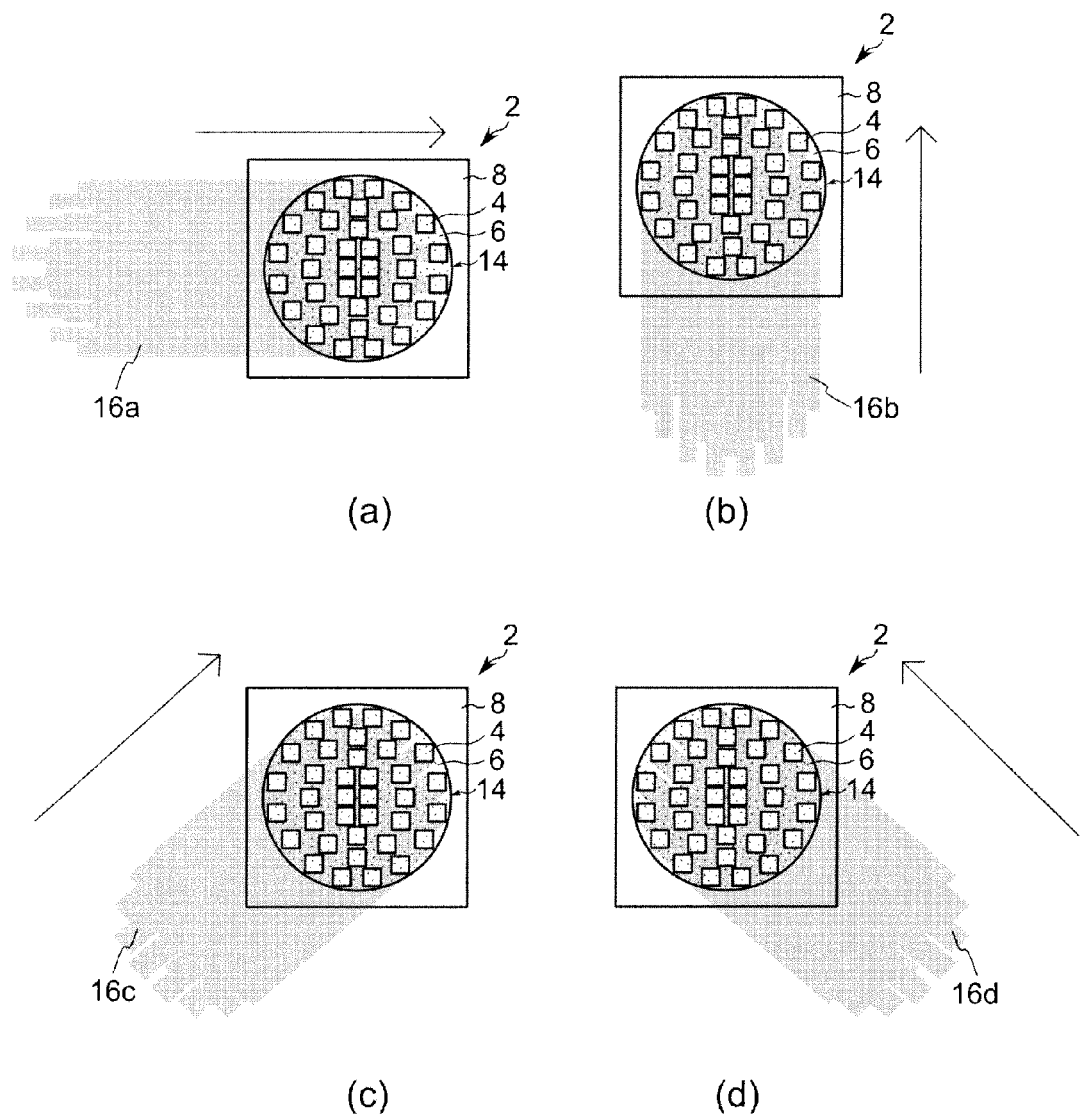
FIGS. 2(a) to 2(d) are diagrams each illustrating a projection of a plurality of light emitting element in a parallel direction.

FIG. 1 is a planar view showing a light emitting device according to an embodiment of the present invention.

As shown in FIG. 1, a light emitting device 2 according to an embodiment of the present invention has a plurality of light emitting elements 4 sealed with a fluorescent material containing member 6. The plurality of light emitting elements 4 and the fluorescent material containing member 6 are housed in a recess of a package 8.

The light emitting device 2 according to an embodiment of the present invention is used in a lighting apparatus, in which the light emitting device 2 is attached to a light-concentrating device such as a reflector or a lens. In an embodiment of the present invention, with a lighting apparatus using a light emitting device 2 of an embodiment of the present invention, light is irradiated on an object (for example, a wall of a room when a lighting apparatus is installed on the sealing of the room) located in an oblique direction of the lighting apparatus or on an object (for example, a floor of a room when a lighting apparatus is installed on the sealing of the room) located in a frontal direction of the lighting apparatus).

In the case where the light emitting device 2 according to an embodiment of the present invention is attached to a light-concentrating device, the center of the light emitting surface 14 is coincident with the focal point of the light-concentrating device.

FIGS. 2(a) to 2(d) are diagrams each illustrating projections of a plurality of light emitting elements 4 in a parallel direction. As shown in FIGS. 2(a) to 2(d), the phrase "projections of a plurality of light emitting elements" may refer to projections of the areas of the light emitting elements 4 in a plane in which the plurality of light emitting elements are disposed.

In a planar view of the light emitting surface 14 (in an embodiment of the present invention, an opening of a recess of a package 8, a plurality of light emitting elements 4 and a fluorescent material containing member 6 are housed in the recess), an optical path of light emitted from the light emitting elements 4 to an object located in an oblique direction from a lighting apparatus matches the traces of the upper surfaces of the plurality of light emitting elements 4 when the plurality of light emitting elements 4 are projected in a parallel direction to the object.

Therefore, in the case where the traces as described above are divided into two portions, the optical path is also divided into two portions: a first optical path and a second optical path. This generates a gap between the first optical path and the second optical path, which generates a region on the object located in an oblique direction from the lighting apparatus, to where the light emitted from the fluorescent material containing member 6 reaches but the light emitted from the light emitting elements 4 does not reach, which results in unevenness in color.

For this reason, a light emitting device 2 according to an embodiment of the present invention has, as shown in FIGS. 2(a) to 2(d), in a planar view of the light emitting surface 14, a plurality of light emitting elements 4 are arranged so that when the plurality of light emitting elements 4 are projected in a parallel direction, the traces of the upper surfaces of the plurality of the light emitting elements 4 merge into a single trace. (For example, the plurality of light emitting elements 4 are arranged so that the traces are merged to obtain a single trace 16a as in FIG. 2(a), a single trace 16b as in FIG. 2(b), a single trace 16c as in FIG. 2(c), and a single trace 16d as in FIG. 2(d), respectively.) As shows in FIGS. 2(a)-2(d), the plurality of light emitting devices may be arranged such that, in a planar view of the light emitting surface 14, when the plurality of light emitting elements 4 are projected in any parallel direction, the traces of the upper surfaces of the plurality of the light emitting elements 4 merge into a single trace.

Each case of the merged trace (for example, the trace 16a, the trace 16b, the trace 16c, and the trace 16d, shown in FIG. 2(a) to FIG. 2(d) respectively) forms a single path filled with the traces of the upper surfaces of the light emitting elements 4 without leaving a gap.

The light emitting device 2 according to an embodiment of the present invention is capable of irradiating an object located in an oblique direction of the lighting apparatus with light which does not have color unevenness.

Figure 3:
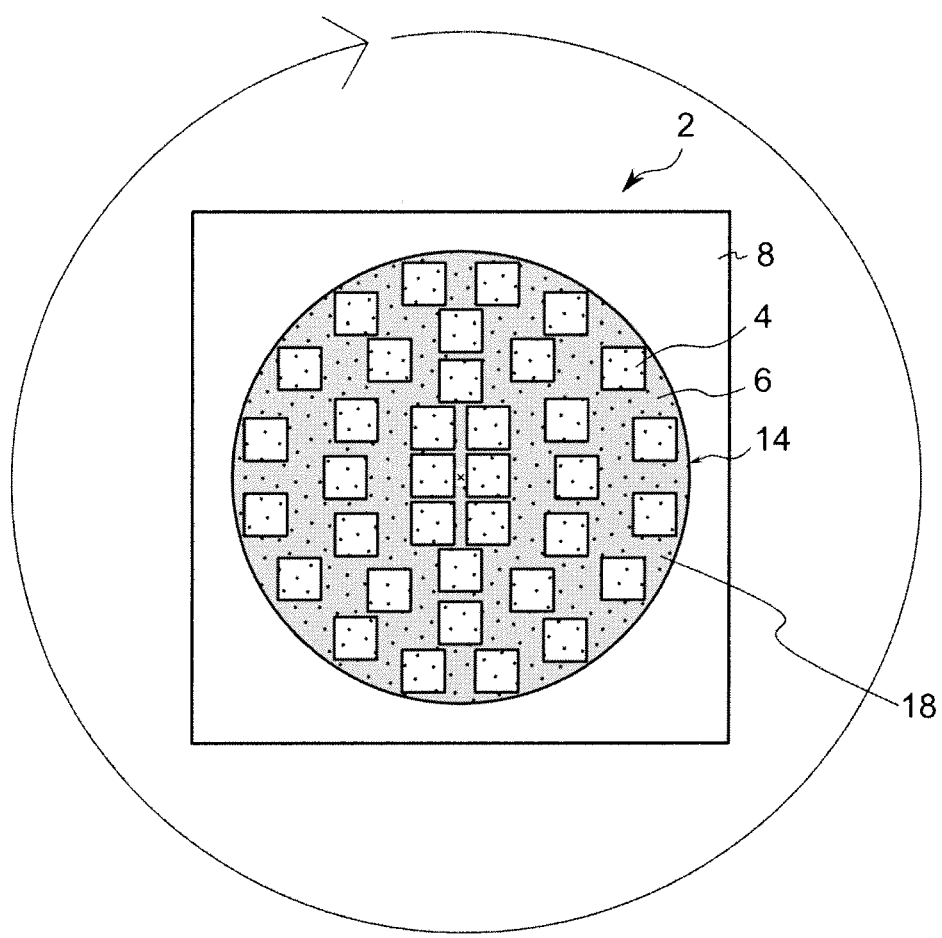
FIG. 3 is a diagram illustrating the traces when the plurality of light emitting elements is rotated around.

FIG. 3 is a diagram illustrating the traces when the plurality of light emitting elements is rotated around.

In a planar view of the light emitting surface 14, an image of light irradiated on an object located in the front direction of the lighting apparatus has the same shape in a different size as the traces of the upper surfaces of the plurality of light emitting elements 4 when the plurality of light emitting elements 4 are rotated around the center of the light emitting surface 14.

Therefore, if the trace as described above is formed in a ring-shape, color unevenness appears in a ring shape on the object located in the front direction of the light emitting device 2.

For this reason, a light emitting device 2 according to an embodiment of the present invention has, as shown in FIG. 3, in a planar view of the light emitting surface 14, a plurality of light emitting elements 4 are arranged so that when the plurality of light emitting elements 4 are rotated around the center of the light emitting surface 14, the traces 18 of the upper surfaces of the plurality of the light emitting elements 4 merge to form a single circle (e.g., a solid, uninterupted circle) centered at the center of the light emitting surface 14.

The light emitting device 2 according to an embodiment of the present invention is capable of irradiating an object located in the front direction of the lighting apparatus with light which does not have color unevenness.

In the light emitting device 2 according to an embodiment of the present invention, in a planar view of the light emitting surface 14, the plurality of the light emitting elements 4 are arranged more densely at a center region of the light emitting surface 14 than at a peripheral region of the light emitting surface 14.

Thus, in the light emitting device 2 according to an embodiment of the present invention, the plurality of light emitting elements 4 are arranged more densely near the center of the light emitting surface 14, so that high luminous intensity and a narrow light distribution can be achieved.

Examples of the configuration in which a plurality of light emitting elements 4 are arranged more densely near the center of the light emitting surface 14 than the peripheral portion of the light emitting surface 14 include a configuration in which in a planar view of the light emitting surface 14, when a circle C of radius R centered at the center of the light emitting surface 14 is drawn on the light emitting surface 14, the plurality of light emitting elements 4 are arranged so that the smaller the radius R, the larger the area density of the light emitting elements 4 obtained by dividing the number of the light emitting elements 4 arranged at least partially in the circle C of radius R (including points on the circle C itself) by the area of the circle C of radius R.

Figure 4:
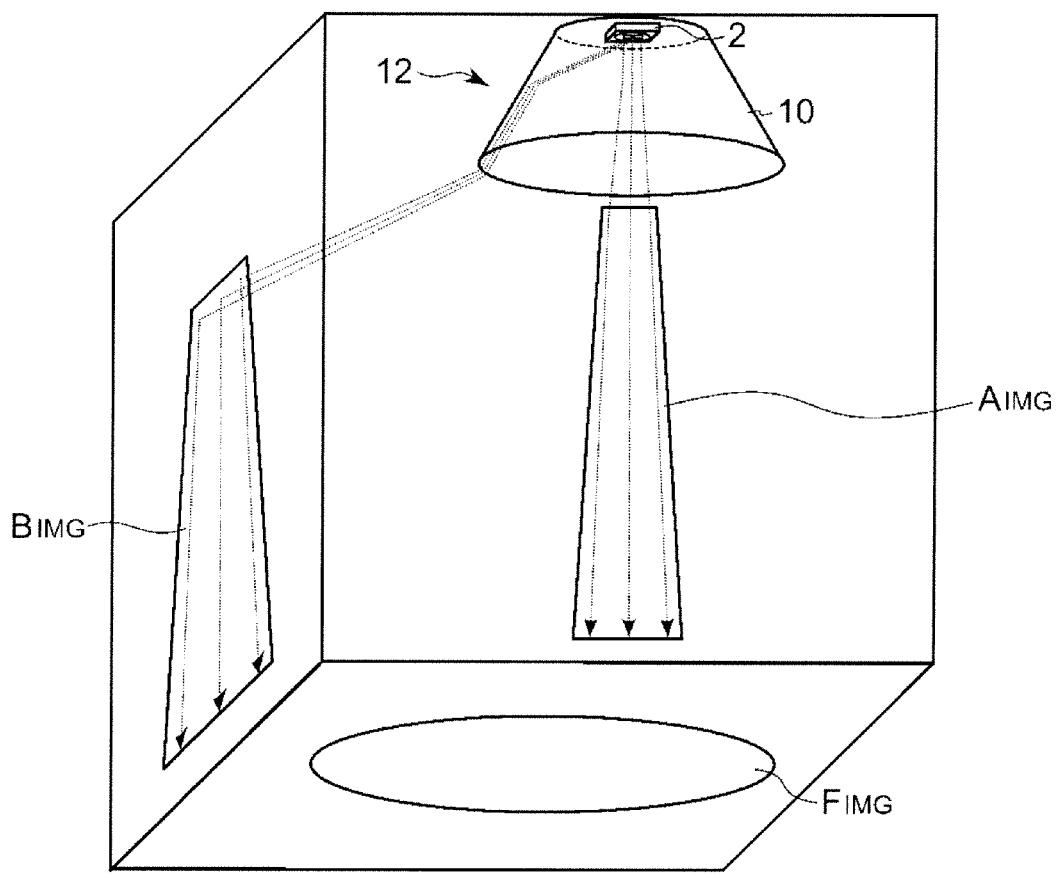
FIG. 4 is a diagram describing irradiation of walls and a floor with a lighting apparatus using a light emitting device according to the present invention.

FIG. 4 is a diagram describing irradiation of walls and a floor with a lighting apparatus using a light emitting device according to the present invention.

As shown in FIG. 4, a lighting apparatus 12 using the light emitting device 2 according to an embodiment of the present invention is capable of irradiating an object located in an oblique direction or in the front direction of the lighting apparatus 12 with light which does not have color unevenness.

Specifically, in the embodiments of the present invention, an oblique direction and the front direction of the light emitting device 2 coincide with an oblique direction and the front direction of the lighting apparatus 12, that is, in FIG. 4, an irradiation image $A_{IMG}$ in the A direction is an image of light irradiated on an object located in the A direction (an example of an oblique direction of the lighting apparatus 12) in FIG. 1, and an irradiation image $B_{IMG}$ in the B direction is an image of light irradiated on an object located in the B direction (an example of an oblique direction of the lighting apparatus 12) in FIG. 1.

In FIG. 4, an irradiation image $F_{IMG}$ in the front direction is an image of light irradiated on an object located in the front direction of the lighting apparatus 12.

The irradiation images described above do not have color unevenness.

The light emitting device 2 according to an embodiment of the present invention is described above. Thus, with the light emitting device 2 according to an embodiment of the present invention, light which has high luminous intensity and a narrow light distribution but does not have color unevenness becomes possible to be irradiated on an object (a wall, floor, etc.) located in the front direction and an oblique direction of the lighting apparatus 12, and an excellent lighting quality can be obtained with the use of a light-concentrating device 10 to condense light.

Now, each member will be described in more detail below.

Package 8

In the light emitting device 2 according to an embodiment of the present invention, an opening of a recess of the package is used as a light emitting surface 14 of the light emitting device 2, but the light emitting surface 14 of the light emitting device 2 may be formed inside the light emitting device 2. For example, in the case where the package 8 is formed to have a first recess and a second recess formed in the bottom of the first recess, and the light emitting elements 4 and a fluorescent material containing member 6 which seal the light emitting elements 4 are housed in the second recess, the opening of the second recess can be exemplified as the light emitting surface 14 of the light emitting device 2.

The package 8 may be formed with a resin molded product. Examples of the material used for the resin molded body include thermoplastic resin such as aromatic polyamide such as PA6T and PA9T and aromatic polyester resin such as LCP, and thermosetting resin such as epoxy resin composition, silicone resin composition, modified epoxy resin composition such as silicone-modified epoxy resin, modified silicone resin composition such as epoxy-modified silicone resin, polyimide resin composition, and modified polyimide resin composition.

Light Emitting Element 4

For the light emitting element 4, a light emitting diode is preferably used, and an appropriate wavelength can be selected according to the usage.

For example, for the light emitting element 4 capable of emitting blue light (light of wavelength 430 nm to 490 nm), a nitride-based semiconductor ($In_XAl_YGa_{1-X-Y}N$, $0 \leq X$, $0 \leq Y$, $X+Y \leq 1$) can be employed. The light emitting elements 4 are, as shown in FIG. 1, respectively formed in a rectangular shape in a planar view. The light emitting element 4 may either be a face-up element having the p-electrode disposed on a first side of the upper surface and the n-electrode disposed on a second side of the upper surface, a face-down element mounted in a flip-chip manner, or a light emitting element having an opposite electrode structure. The component composition, emission color, size, etc. of each of the light emitting elements 4 are not limited to those described above, and can be selected appropriately according to the purpose.

Fluorescent Material Containing Member 6

Examples of the fluorescent material containing member 6 include a light transmissive resin mixed with one or plural kinds of fluorescent material particles.

In the fluorescent material containing member 6, one or plural kinds of light-diffusing materials may be mixed at an appropriate time. With this arrangement, uneven color and uneven brightness can be reduced and inner stress can be reduced, so that reliability can be enhanced.

Light-Concentrating Device 10

For the light-concentrating device 10, a lens, a reflector, or the like, can be used, for example.

In the present specification, in order to facilitate understanding of the light emitting device 2 according to an embodiment of the present invention, the explanation of the members other than described above is omitted; however, it is needless to say that a conductive member for supplying electric current to the light emitting elements 4 and the like can be disposed on the package 8.

Figure 5A:
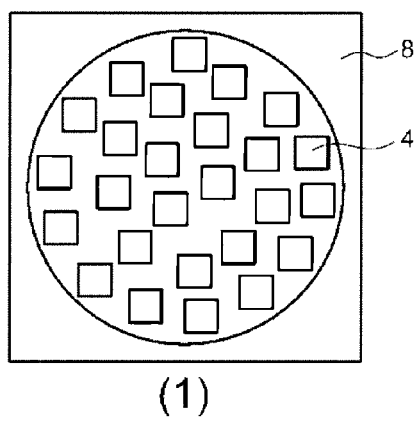
FIGS. 5A(1) to 5A(5) are diagrams each showing a planar view of a light emitting device according to another embodiment of the present invention.
Figure 5A:
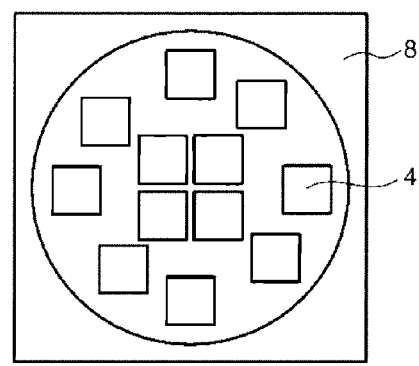
Figure 5A:
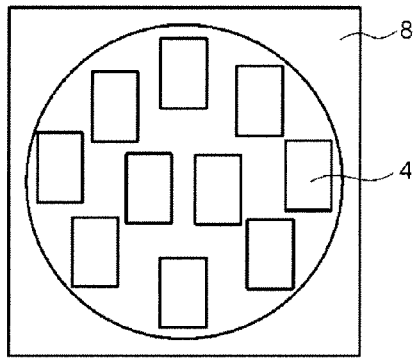
Figure 5A:
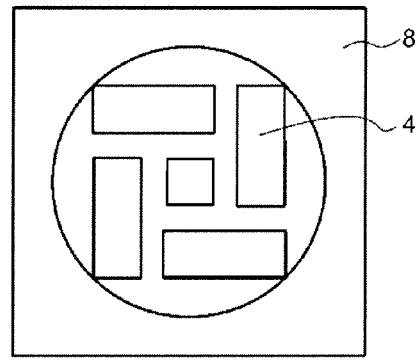
Figure 5A:
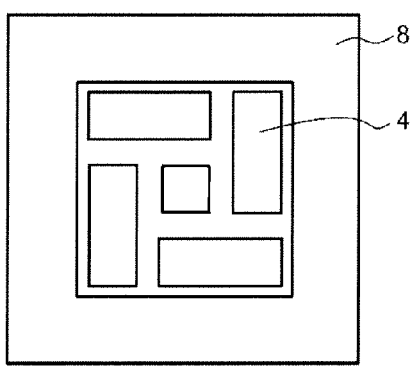
Figure 5B:
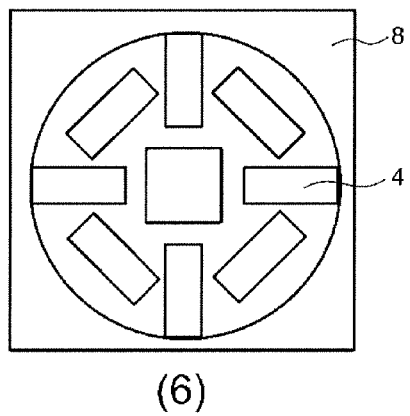
FIGS. 5B(6) to 5B(9) are diagrams each showing a planar view of a light emitting device according to another embodiment of the present invention.
Figure 5B:
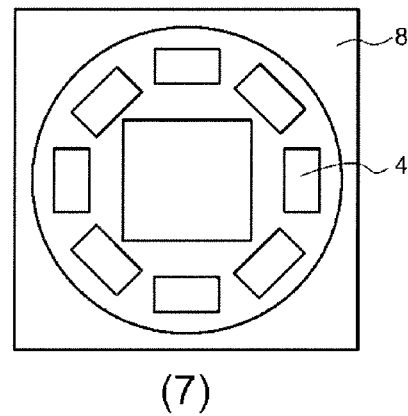
Figure 5B:
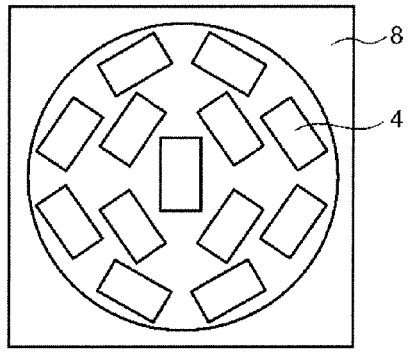
Figure 5B:
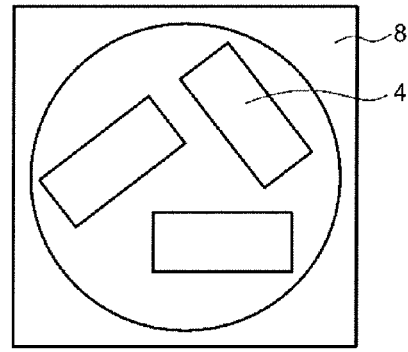

FIGS. 5A(1) to 5A(5) and FIGS. 5B(6) to 5B(9) are diagrams showing planar views of various kinds of light emitting device according to embodiments of the present invention. In the examples shown in FIGS. 5A(1) to 5A(5) and FIGS. 5B(6) to 5B(9), the opening of the recess of the respective packages 8 serves as the light emitting surface of each light emitting device.

The light emitting devices shown in FIGS. 5A(1) to 5A(5) and FIGS. 5B(6) to 5B(9) are examples of the light emitting devices in which, in a planar view of the light emitting surface, when a plurality of light emitting elements 4 are projected in a parallel direction, the traces of the upper surfaces of the plurality of light emitting elements 4 merge into a single trace. Even with such simple arrangements, as in the manner described above, when a straight line is drawn between adjacent light emitting elements 4, the straight line always passes through a third light emitting element 4. Thus, when the plurality of light emitting elements 4 are projected in a parallel direction, the traces of the upper surfaces of the plurality of light emitting elements 4 can be formed into a single trace.

The light emitting devices shown in FIGS. 5A(1) to 5A(5) and FIGS. 5B(6) to 5B(8) are examples of the light emitting devices whose light emitting surfaces can be filled with the traces of the upper surfaces of a plurality of light emitting elements 4. Even with such simple arrangements, in the same manner as the configurations described above, when a straight line is drawn between adjacent light emitting elements 4, the straight line always passes through a third light emitting element 4. Thus, when the plurality of light emitting elements 4 are projected in a parallel direction, the traces of the upper surfaces of the plurality of light emitting elements 4 can be formed into a single trace. With those configurations, the light emitting surfaces can be filled with the traces of the upper surfaces of the plurality of light emitting elements 4.

The light emitting devices shown in FIGS. 5A(2) and 5A(3) are examples of the light emitting devices in which, in a planar view of the light emitting surface, when a plurality of light emitting elements 4 are projected in a parallel direction, the traces of the upper surfaces of the plurality of light emitting elements merge into a single trace. Even with such simple arrangements, when the plurality of light emitting elements 4 are rotated around the center of the light emitting surface 14, the traces 18 of the upper surfaces of the plurality of the light emitting elements 4 can be merged to form a single circle centered at the center of the light emitting surface 14.

The light emitting devices shown in FIGS. 5A(2), 5A(4), 5A(5) and FIGS. 5B(6) to 5B(8) are examples of the light emitting devices in which, in a planar view of the light emitting surface, the plurality of the light emitting elements are arranged more densely at a center region of the light emitting surface than at a peripheral region of the light emitting surface. Even with such simple arrangements, in the same manner as the configurations described above, the plurality of the light emitting elements 4 can be arranged more densely at a center region of the light emitting surface than at a peripheral region of the light emitting surface.

In the light emitting devices shown in FIGS. 5A(4), 5A(5) and FIGS. 5B(6) and 5B(7), light emitting elements having upper surfaces of different shapes (for example a square shape and a rectangular shape) and/or of different sizes are used as the plurality of light emitting elements 4. Even with such simple arrangements, in the same manner as the configurations described above, when a straight line is drawn between adjacent light emitting elements 4, the straight line always passes through a third light emitting element 4. Thus, when the plurality of light emitting elements 4 are projected in a parallel direction, the traces of the upper surfaces of the plurality of light emitting elements 4 can be formed into a single trace. Those configurations facilitate to fill the light emitting surface with the traces of the upper surfaces of the plurality of light emitting elements 4.

In the light emitting devices shown in FIGS. 5B(6) to 5B(9), a part of the plurality of light emitting elements 4 are arranged at an angle along the circular periphery of the light emitting surface. Even with such simple arrangements, in the same manner as the configurations described above, when a straight line is drawn between adjacent light emitting elements 4, the straight line always passes through a third light emitting element 4. Thus, when the plurality of light emitting elements 4 are projected in a parallel direction, the traces of the upper surfaces of the plurality of light emitting elements 4 can be formed into a single trace. These configurations facilitate the filling of the light emitting surface with the traces of the upper surfaces of the plurality of light emitting elements 4.

In the light emitting device shown in FIG. 5A(1), in a planar view of the light emitting surface, a plurality of light emitting elements 4 are arranged misaligned to produce a longitudinally asymmetrical and laterally asymmetrical configuration. Even with such simple arrangements, in the same manner as the configurations described above, when a straight line is drawn between adjacent light emitting elements 4, the straight line always passes through a third light emitting element 4. Thus, when the plurality of light emitting elements 4 are projected in a parallel direction, the traces of the upper surfaces of the plurality of light emitting elements 4 can be formed into a single trace. Those configurations facilitate the filling of the light emitting surface with the traces of the upper surfaces of the plurality of light emitting elements 4.

The plurality of light emitting elements 4 can be arranged so that the plurality of light emitting elements 4, in a planar view of the light emitting surface, are arranged misaligned to produce a longitudinally asymmetrical and laterally asymmetrical configuration. Even with such simple arrangements, in the same manner as the configurations described above, when a straight line is drawn between adjacent light emitting elements 4, the straight line always passes through a third light emitting element 4. Thus, when the plurality of light emitting elements 4 are projected in a parallel direction, the traces of the upper surfaces of the plurality of light emitting elements 4 can be formed into a single trace. These configurations facilitate the filling of the light emitting surface with the traces of the upper surfaces of the plurality of light emitting elements 4.

As is evident from a comparison of the light emitting device shown in FIG. 5A(4) and the light emitting device shown in FIG. 5A(5), forming of the light emitting surface in a quadrangular shape (for example a square shape or a rectangular shape) facilitates the filling of the light emitting surface with the traces of the upper surfaces of the plurality of light emitting elements 4.

Next, light emitting devices 2 according to Comparative Examples 1 to 3 will be described below.

Comparative Example 1

Figure 6:
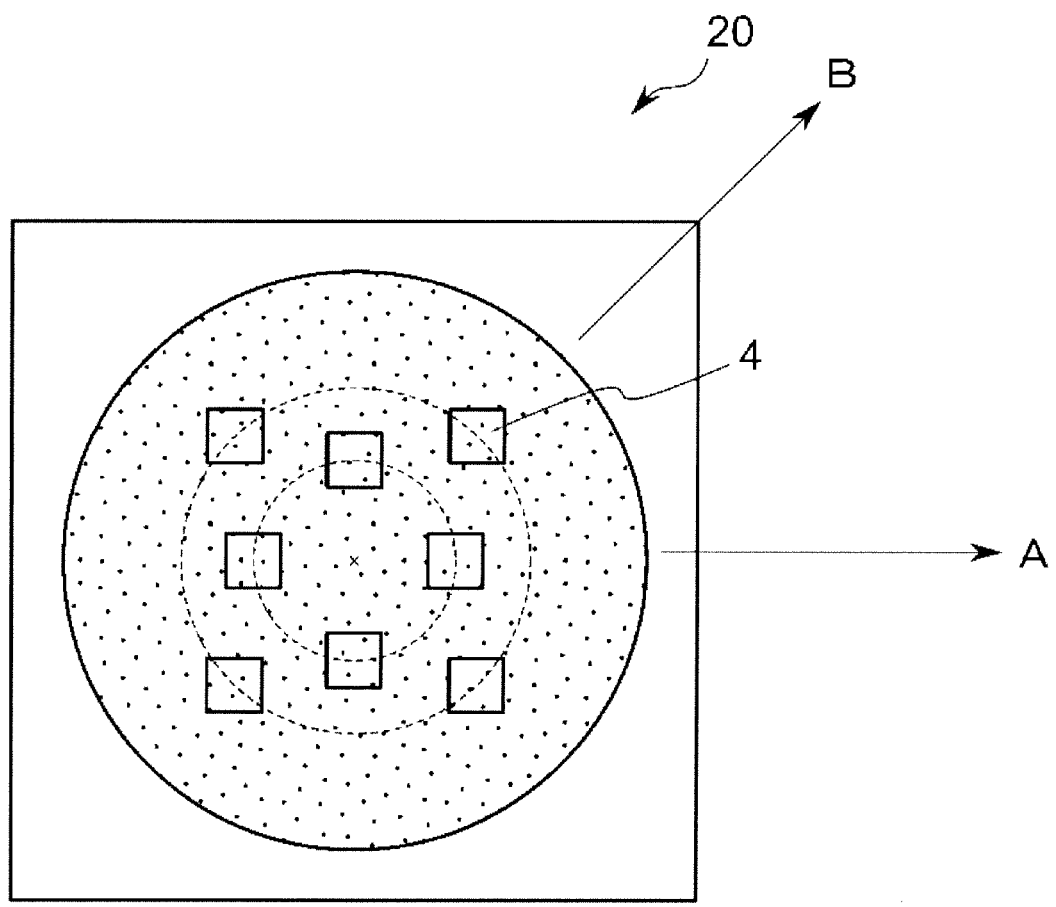
FIG. 6 is a planar view showing a light emitting device according to Comparative Example 1.
Figure 7:
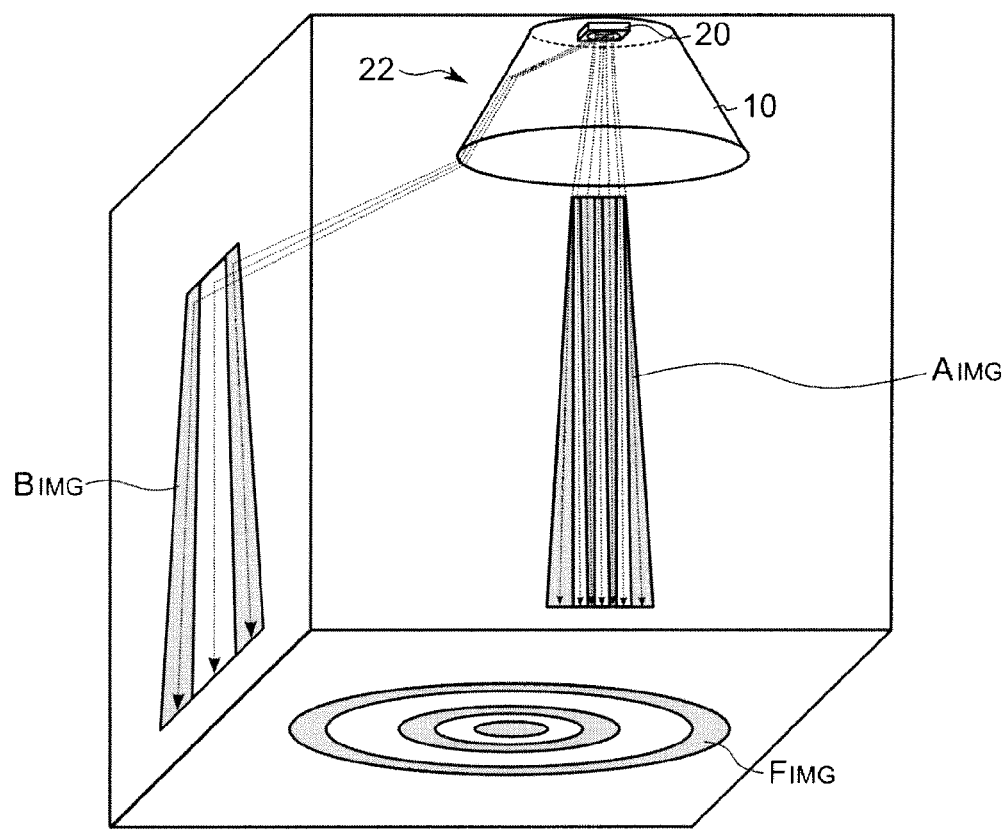
FIG. 7 is a diagram describing irradiation of walls and a floor with a lighting apparatus using a light emitting device according to Comparative Example 1.

FIG. 6 is a planar view of a light emitting device according to Comparative Example 1 and FIG. 7 is a diagram describing irradiation of walls and a floor with a lighting apparatus using a light emitting device according to Comparative Example 1.

As shown in FIG. 6, in the light emitting device 20 according to Comparative Example 1, the plurality of light emitting elements 4 are arranged to form a plurality of true circles (i.e., concentric circles).

As shown in FIG. 7, from a lighting apparatus 22 which uses a light emitting device 20 according to Comparative Example 1, light with a linear color unevenness is irradiated on the wall and light with a circular color unevenness is irradiated on the floor.

Specifically, in Comparative Example 1, an oblique direction and the front direction of the light emitting device 20 coincide with an oblique direction and the front direction of the lighting apparatus 22, that is, in FIG. 7, an irradiation image $A_{IMG}$ in the A direction is an image of light irradiated on an object located in the A direction (an example of an oblique direction of the lighting apparatus 22) in FIG. 6, and an irradiation image $B_{IMG}$ in the B direction is an image of light irradiated on an object located in the B direction (an example of the front direction of the lighting apparatus 22) in FIG. 6.

In FIG. 7, an irradiation image $F_{IMG}$ in the front direction is an image of light irradiated on an object located in the front direction of the lighting apparatus 22.

The irradiation images described above have color unevenness.

Installation of a light-diffusing material to the light emitting device 20 to reduce those color unevenness will lead to a reduction in the luminous intensity and an increase in the light distribution area in the lighting apparatus 22, which results in a decrease in the quality of lighting.

Comparative Example 2

Figure 8:
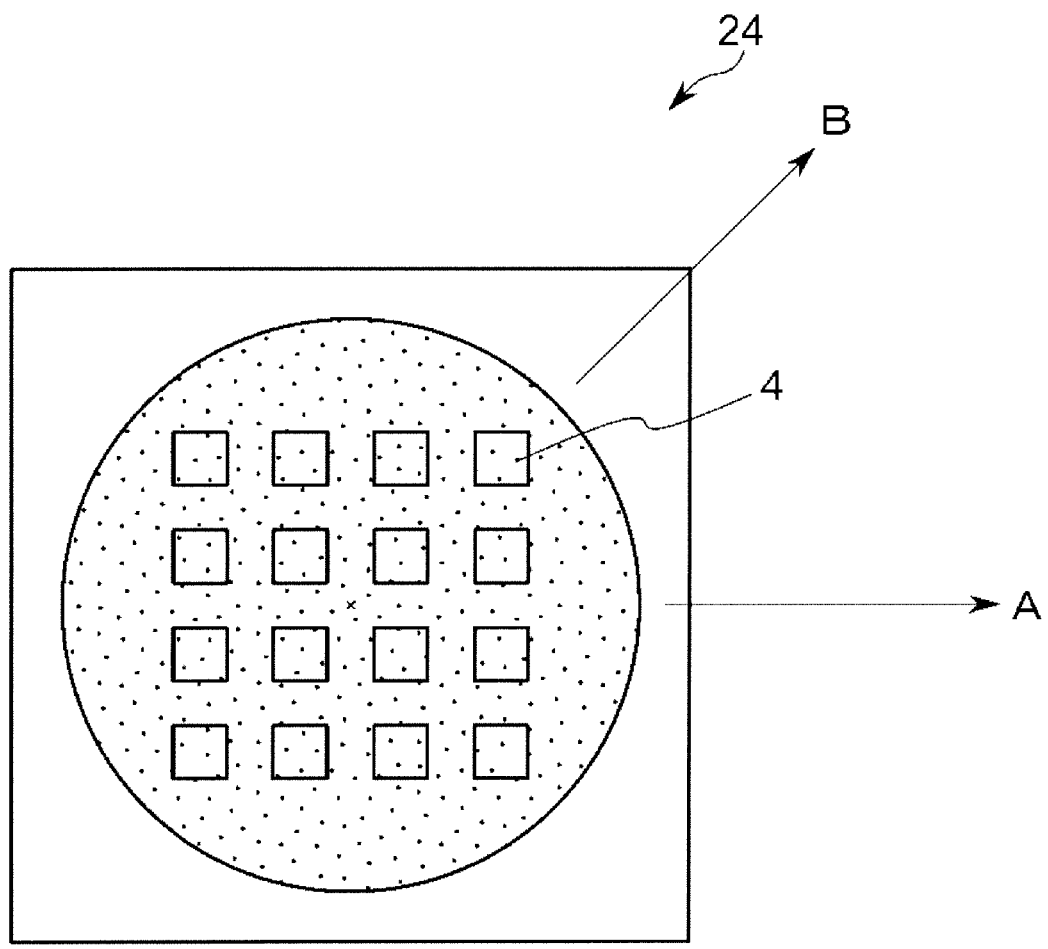
FIG. 8 is a planar view showing a light emitting device according to Comparative Example 2.
Figure 9:
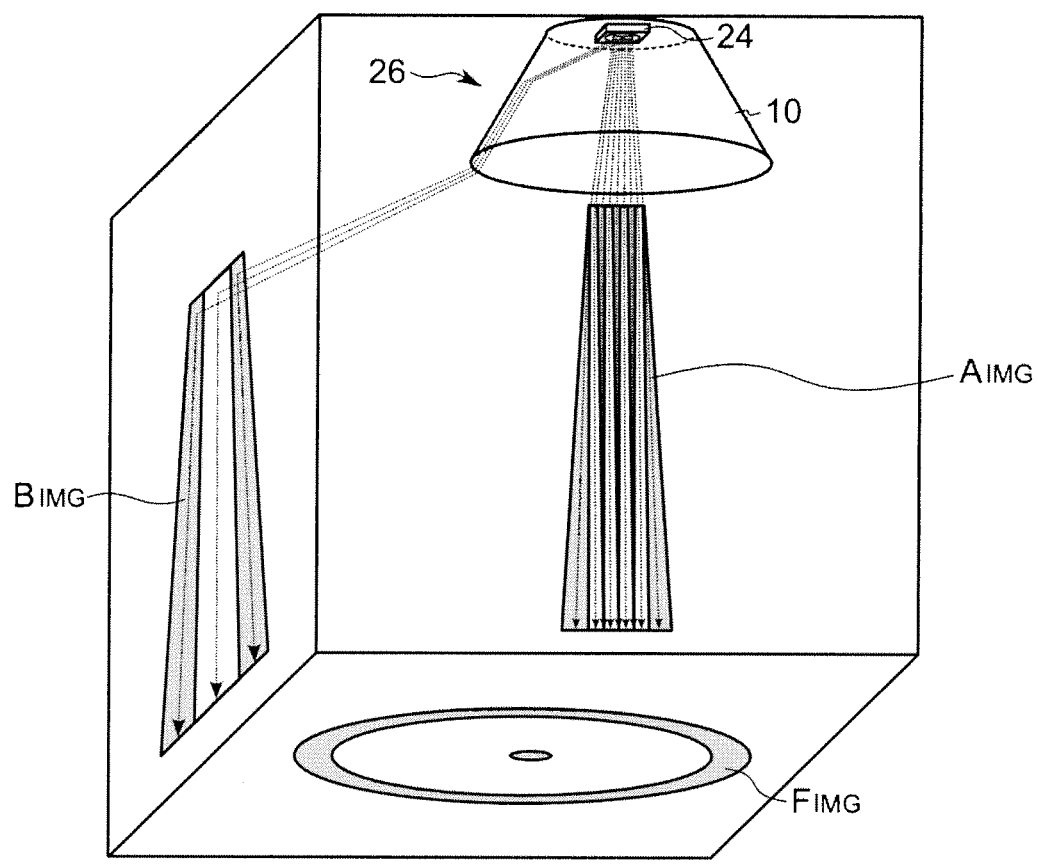
FIG. 9 is a diagram describing irradiation of walls and a floor with a lighting apparatus using a light emitting device according to Comparative Example 2.

FIG. 8 is a planar view of a light emitting device according to Comparative Example 2 and FIG. 9 is a diagram describing irradiation of walls and a floor with a lighting apparatus using a light emitting device according to Comparative Example 2.

As shown in FIG. 8, in the light emitting device 24 according to Comparative Example 2, the plurality of light emitting elements 4 are arranged into columns and rows.

As shown in FIG. 9, from a lighting apparatus 26 which uses a light emitting device 24 according to Comparative Example 2, light with a linear color unevenness is irradiated on the wall and light with a circular color unevenness is irradiated on the floor.

Specifically, in Comparative Example 2, an oblique direction and the front direction of the light emitting device 24 coincide with an oblique direction and the front direction of the lighting apparatus 26, that is, in FIG. 9, an irradiation image $A_{IMG}$ in the A direction is an image of light irradiated on an object located in the A direction (an example of an oblique direction of the lighting apparatus 26) in FIG. 8, and an irradiation image $B_{IMG}$ in the B direction is an image of light irradiated on an object located in the B direction (an example of the front direction of the lighting apparatus 26) in FIG. 8.

In FIG. 9, an irradiation image $F_{IMG}$ in the front direction is an image of light irradiated on an object located in the front direction of the lighting apparatus 26.

The irradiation images described above have color unevenness.

Installation of a light-diffusing material to the light emitting device 24 to reduce those color unevenness will lead to a reduction in the luminous intensity and an increase in the light distribution area in the lighting apparatus 26, which results in a decrease in the quality of lighting.

Comparative Example 3

Figure 10:
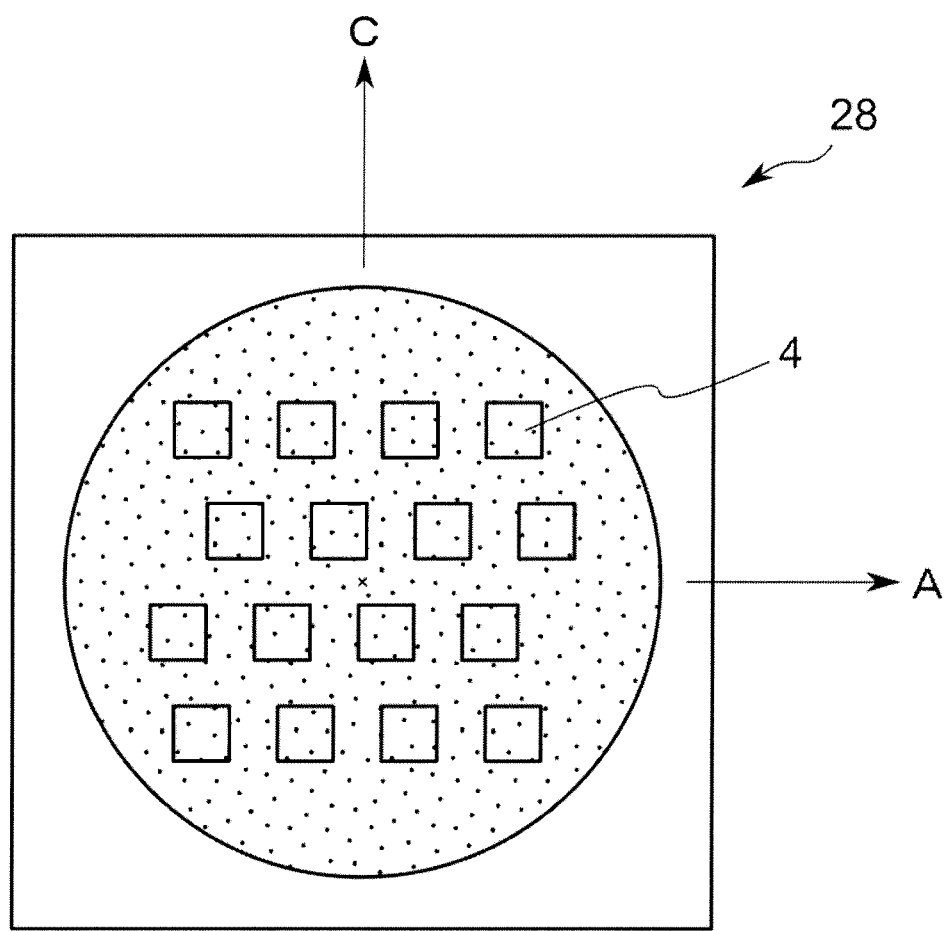
FIG. 10 is a planar view showing a light emitting device according to Comparative Example 3.
Figure 11:
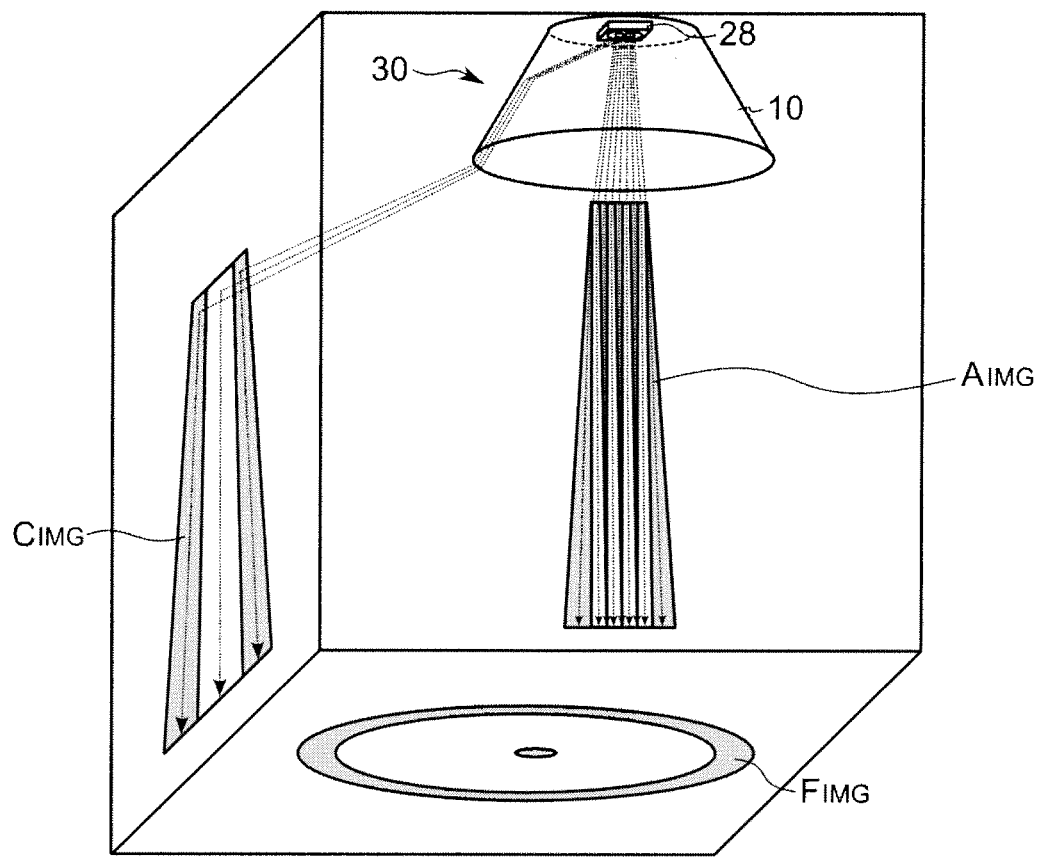
FIG. 11 is a diagram describing irradiation of walls and a floor with a lighting apparatus using a light emitting device according to Comparative Example 3.

FIG. 10 is a planar view of a light emitting device according to Comparative Example 3 and FIG. 11 is a diagram describing irradiation of walls and a floor with a lighting apparatus using a light emitting device according to Comparative Example 3.

As shown in FIG. 10, in the light emitting device 28 according to Comparative Example 3, the plurality of light emitting elements 4 are arranged in a zigzag manner.

As shown in FIG. 11, from a lighting apparatus 30 which uses a light emitting device 28 according to Comparative Example 3, light with a linear color unevenness is irradiated on the wall and light with a circular color unevenness is irradiated on the floor.

Specifically, in Comparative Example 3, an oblique direction and the front direction of the light emitting device 28 coincide with an oblique direction and the front direction of the lighting apparatus 30, that is, in FIG. 11, an irradiation image $A_{IMG}$ in the A direction is an image of light irradiated on an object located in the A direction (an example of an oblique direction of the lighting apparatus 30) in FIG. 10, and an irradiation image $C_{IMG}$ in the C direction is an image of light irradiated on an object located in the C direction (an example of an oblique direction of the lighting apparatus 30) in FIG. 10.

In FIG. 11, an irradiation image $F_{IMG}$ in the front direction is an image of light irradiated on an object located in the front direction of the lighting apparatus 30.

The irradiation images described above have color unevenness.

Installation of a light-diffusing material to the light emitting device 28 to reduce those color unevenness will lead to a reduction in the luminous intensity and an increase in the light distribution area in the lighting apparatus 30, which results in a decrease in the quality of lighting.

As illustrated above, embodiments of the present invention and Comparative Examples are described to show that the light emitting devices and the lighting apparatuses according to embodiments of the present invention are capable of providing excellent lighting quality even with using a light-concentrating device for condensing light.

The light emitting devices and lighting apparatuses according to embodiments of the present invention described above capable of providing excellent lighting quality even with using a light-concentrating device for condensing light will be described further below.

Figure 12:
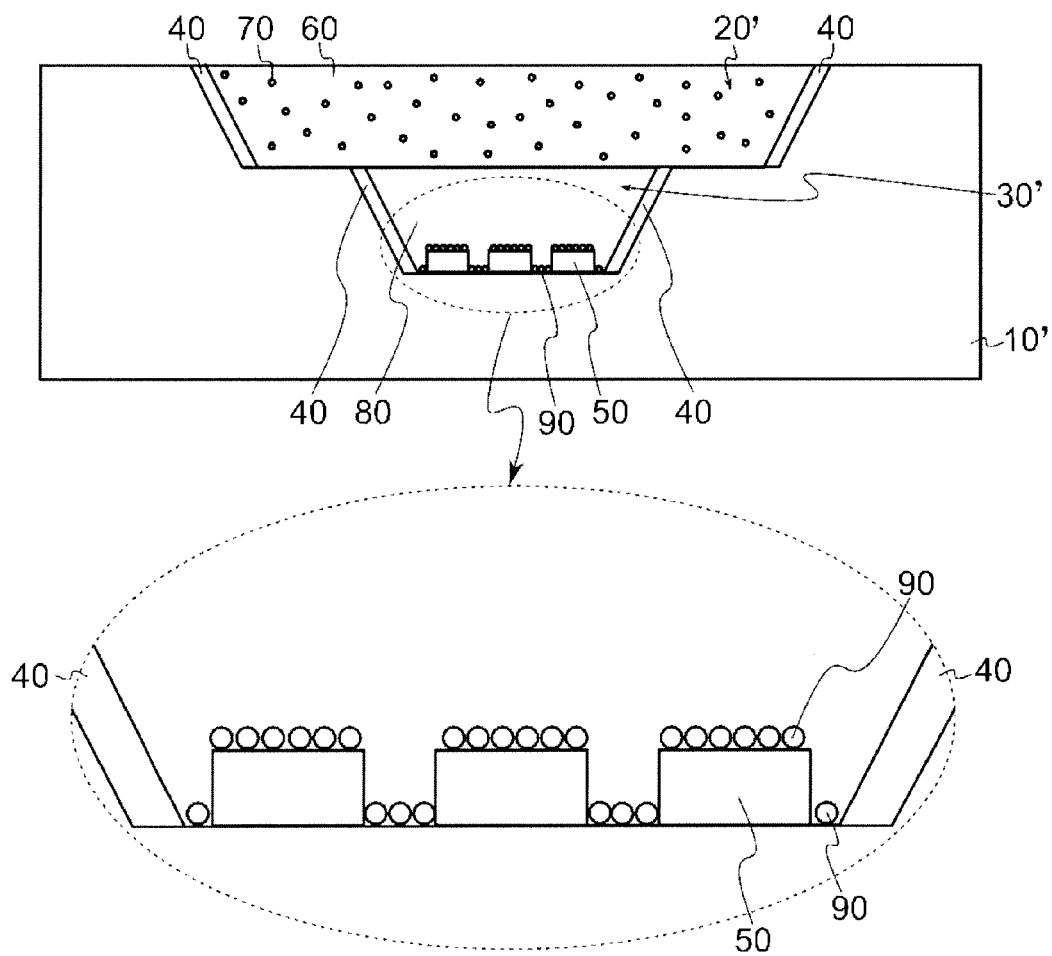
FIG. 12 is a schematic cross-sectional view of a light emitting device according to an embodiment of the present invention.

FIG. 12 is a schematic cross-sectional view of a light emitting device according to an embodiment of the present invention.

As shown in FIG. 12, a light emitting device according to an embodiment of the present invention includes a first recess 20', a second recess 30' formed in the bottom surface of the first recess 20', a plurality of light emitting elements 50 arranged on the bottom surface of the second recess 30', a first layer 60 containing light-diffusing material particles 70 and sealing the first recess 20', and a second layer 80 containing fluorescent material particles 90 and sealing the second recess 30'. The first recess 20' and the second recess 30' are formed in the package 10'.

A light emitting device according to an embodiment of the present invention has the first layer 60 containing light-diffusing material particles 70 disposed on the first recess 20', and the second layer 80 containing fluorescent material particles 90 disposed on the second recess 30', and has the first recess 20' and the second recess 30' arranged in a two-step structure of an upper step and a lower step respectively.

A light emitting device according to the present embodiment has a first layer 60 which substantially does not contain fluorescent material particles.

Thus, according to the light emitting device according to an embodiment of the present invention, the first layer 60 containing the light-diffusing material particles 70 and the second layer 80 containing the fluorescent material particles 90 have an uniform thickness, so that uneven brightness, uneven color, and uneven light distribution at the light emitting surface (the upper surface defining the first recess 20') can be reduced.

In a light emitting device according to an embodiment of the present invention, undiffused light passes through the second layer 80 containing the fluorescent material particles 90. In other words, light emitted from the light emitting element 50 passes through the second layer 80 containing the fluorescent material particles 90 then passes through the light-diffusing layer.

Therefore, with the light emitting device according to an embodiment of the present invention, the occurrence of uneven brightness, uneven color, and uneven light distribution can be prevented at the second layer 80. Even if uneven brightness, uneven color, and uneven light distribution occur at the second layer 80, they can be reduced by diffusing light at the first layer 60 before being emitted from the light emitting device. Thus, according to the light emitting device according to an embodiment of the present invention, uneven brightness, uneven color, and uneven light distribution of the light emitting device can be reduced.

Hereinafter, the details will be described.

Package 10'

The package 10' has a two-step recess (first recess 20' and second recess 30') disposed therein. The second recess 30' is formed in the bottom surface of the first recess 20', where a step difference is formed between the side surface of the second recess 30' and the bottom surface of the first recess 20'.

Thus, in the light emitting device according to an embodiment of the present invention, at the time of sealing the second recess 30' with the second layer 80, due to the surface tension of the second layer 80, generation of sink mark (a state where a depression occurs in the upper surface of the second layer 80 at the interface with the first layer 60 in the vicinity of the upper surface of the second recess 30') at the interface between the first recess 20' and the second recess 30' is prevented, so that the second layer 80 can be formed with a uniform thickness.

Accordingly, when the light emitting surface is taken in plan view, a constant ratio of the light emitting element to the fluorescent material particles per unit area can be obtained, so that a uniform length of optical path can be obtained throughout the second layer 80, and thus occurrence of uneven brightness, uneven color, and uneven light distribution at the second layer 80 can be prevented.

Also, with the light emitting device according to an embodiment of the present invention, the second layer 80 can be formed with an uniform thickness, so that the first layer 60 which is formed over the second layer 80 can also formed with a uniform thickness.

Thus, with the light emitting device according to an embodiment of the present invention, the light-diffusing effect by the first layer 60 occurs almost uniformly in the first layer 60, so that a same degree of light-diffusing can be obtained throughout in the first layer 60. Thus, even if uneven brightness, uneven color, and uneven light distribution occur in the second layer 80, the degree of those can be reduced by the light-diffusing in the first layer 60 before the light is emitted to outside from the light emitting device.

Further, with the light emitting device according to an embodiment of the present invention, both the first layer 60 and the second layer 80 formed respectively on the two-step recesses have a uniform thickness, which allows a same amount of light beams to be emitted from various regions of the upper surface of the second layer 80 and enter the first layer 60, and a same amount of light beams to be emitted from various regions of the upper surface of the first layer 60. Thus, uneven brightness, uneven color, and uneven light distribution can be prevented.

Also, the light emitting device according to an embodiment of the present invention has a structure in which the second recess 30', which is the lower, is formed in a part of the bottom surface of the first recess 20', which is the upper, and thus, the light emitted from the second recess 30' formed in a part of the bottom surface of the first recess 20' can be diffused in the first recess 20'.

Thus, according to the light emitting device of an embodiment of the present invention, the first recess 20' and the second recess 30' can serve different functions. (In the second recess 30', the light emitted from the plurality of light emitting elements 50 and the light emitted from the fluorescent material particles 50 are combined to create a uniform white light. (Here, the fluorescent material particles 90 are excited by the light emitted from the plurality of light emitting elements 50 and emit light having a different wavelength from that of the plurality of light emitting elements 50.) In the first recess 20', the light emitted from the second recess 30' is diffused with no change in its color (that is its wavelength). Thus, uneven brightness, uneven color, and uneven light distribution at the light emitting surface can be reduced.

The second recess 30' can have a vertical side surface, but a tapered shape is preferable as in the light emitting device according to an embodiment of the present invention. This arrangement can facilitate guiding of the light emitted from the light emitting elements 50 to the upper surface (the upper surface of the first recess 20') of the light emitting device, and thus the light extraction efficiency can be improved.

The size of the opening of the second recess 30' is not specifically limited, but is preferably capable of providing a region in the first recess 20' (for example on the bottom surface of the first region 20') so that mounting a protective element such as a Zener diode or performing a wire bonding for supplying power can be performed.

With such an arrangement, in addition to it being possible to arrange a plurality of light emitting elements in a scattered manner on the base surface of the second recess 30', the amount of light reaching the reflecting surface of the first recess 20' can be reduced, so that a high light condensing rate of the light-concentrating device can be achieved, which can facilitate control of the light distribution even in a small lighting apparatus.

In the case where both the opening of the first recess 20' and the opening of the second recess 30' are formed in a circular shape for example, it is preferable to have a relationship of: (opening diameter of the second recess 30')≤(opening diameter of the first recess 20')−2 mm. With this arrangement, a region sufficient for mounting a protective element such as a Zener diode or performing a wire bonding for supplying power can be provided in the first recess 20' (for example, the bottom surface of the first recess 20'), and in addition to this, the amount of light reaching the reflective surface of the first recess 20' can be further reduced, so that the light condensing rate of the light-concentrating device can be further increased, which can further facilitate control of the light distribution even in a small lighting apparatus.

The outer shape of the package 10' is not specifically limited, and for example, a quadrangular shape, a polygonal shape, a circular shape, an elliptical shape or a shape which is a combination of those can be employed.

The first recess 20' can be formed singly in a single package 10' or in plural in a single package 10'. The second recess 30' can be formed singly in a single first recess 20' or as two or more second recesses in a single first recess 20'.

The top-view shape of the first recess 20' and the second recess 30' are not specifically limited, and for example, a circular shape, an elliptic shape, a polygonal shape, or a shape which is a combination of these shapes can be employed. The top-view shape of the second recess 30' can be different from the top-view shape of the first recess 20' or the same shape with a different size.

The package 10' may be formed with a resin molded product. Examples of such a resin molded body include thermoplastic resin such as aromatic polyamide such as PA6T and PA9T and aromatic polyester resin such as LCP, and thermosetting resin such as epoxy resin composition, silicone resin composition, modified epoxy resin composition such as silicone-modified epoxy resin, modified silicone resin composition such as epoxy-modified silicone resin, polyimide resin composition, and modified polyimide resin composition.

Reflective Member 40

The first recess 20' and the second recess 30' are not necessarily provided with a certain member on their side surface, but in the light emitting device according to an embodiment of the present invention, a reflective member 40 made of such as a molding material containing Al, Ag, or $TiO_2$ is respectively disposed on a side surface of the first recess 20' and the second recess 30'. In the case where a reflective member 40 is provided, it can be disposed on a side surface of the first recess 20' and/or the second recess 30'.

Generally, disposing a reflective member 40 on the side surfaces of the recess which is sealed with a layer containing light-diffusing material particles 70 increases the brightness at the upper surface of the light emitting elements 50 and the side surfaces of the recess, resulting in an increase of uneven brightness at the light emitting surface and also creates a difference in the color tone at a portion having a high brightness at the upper surface of the light emitting elements 50 and at portions where only the fluorescent material emits light, resulting in an increase of uneven color at the light emitting surface.

However, in the light emitting device according to an embodiment of the present invention, the first layer 60 which contains light-diffusing material particles 70 has a uniform thickness, so that a same degree of light diffusion can be obtained throughout in the first layer 60. Therefore, a uniform brightness can be obtained at the light emitting surface (the upper surface of the recess sealed with a layer containing light-diffusing material particles 70) and the reflective surface (the side surfaces of the recess sealed with a layer containing light-diffusing material particles 70), so that uneven brightness and uneven color described above can be reduced.

Generally, the amount of optical loss which occurs every time when the light is reflected at the reflective member 40 may be approximately 2 to 10%, which may be further increased by repetitive reflection at the reflective member 40. However, according to a light emitting device of an embodiment of the present invention, light-diffusing does not occur at the second recess 30', so that light can be guided to the first recess 20' with a minimum number of reflections.

Also, the light guided from the second recess 30' to the first recess 20' passes through the top surface of the second recess 30' and reaches above the first recess 30' in the first recess 20'. Thus, in a light emitting device according to an embodiment of the present invention having the area of the upper surface of the second recess 30' smaller than the area of the bottom surface of the first recess 20', so that the amount of light reaching the reflective member 40 disposed on the side surfaces of the first recess 20' lessens. Thus, according to a light emitting device of an embodiment of the present invention, optical loss due to reflection at the side surfaces of the recess of the package 10' can be reduced and the light extraction efficiency can be improved.

Plurality of Light Emitting Elements 50

A plurality of light emitting elements 50 are arranged on the bottom surface of the second recess 30'. The plurality of light emitting elements 50 may be disposed directly or indirectly, through an appropriate member, on the bottom surface of the second recess 30'.

The arrangement configuration of the plurality of light emitting elements 50 is not specifically limited, but the plurality of light emitting elements 50 are preferably disposed on the bottom surface of the second recess 30' in a scattered manner. Such arrangement enables a reduction in a region that spreads between the light emitting elements 50 disposed at the most peripheral portion of the bottom surface of the second recess 30' and the side surfaces of the second recess 30' and where only the fluorescent material particles 90 emit light, and thus color unevenness can be reduced.

Arranging the plurality of light emitting elements 50 on the bottom surface of the second recess 30' in a scattered manner enables propagation of light to the entire region of the second layer. Thus, a light emitting region having an effective width and depth can be secured even when the width and the depth of the second recess 30' are reduced.

Also, providing a region for wire bonding for supplying electricity and a region for mounting a member such as a protective element such as a Zener diode, which are in many cases provided on the same surface on which the light emitting elements 50 are mounted, on the first recess 20' can eliminate the need to provide those regions on the bottom surface of the second region 30'. Thus, the light emitting elements 50 can be arranged close to the outer periphery of the bottom surface of the second recess 30', and therefore, the plurality of light emitting elements 50 can be arranged on the bottom surface of the second recess 30' in a scattered manner.

For the light emitting elements 50, semiconductor light emitting elements 50 with appropriate wavelengths can be used. For example, for the light emitting element 50 capable of emitting blue or green light, ZnSe, a nitride-based semiconductor ($In_XAl_YGa_{1-X-Y}N$, 0≤X, 0≤Y, X+Y≤1), or GaP can be employed. For the light emitting elements 50 capable of emitting red light, GaAlAs, AlInGaP, or the like can be employed. Further, the semiconductor light emitting elements 50 made of materials other than those described above can also be employed. The compositions, emission colors, sizes and the number of the light emitting elements 50 to be used can be selected appropriately according to the purposes.

First Layer 60

The first layer 60 seals the first recess 20'. The degree of sealing is not strictly limited, but for example, the first recess 20' is sealed from the bottom surface to the upper plane of the first recess 20'.

The first layer 60 contains the light-diffusing material particles 70. This arrangement enables light passing through the second layer 80 to be diffused in the first layer 60 and then emitted from the light emitting device, so that uneven brightness, uneven color, and uneven light distribution at the light emitting surface can be reduced.

One or plural kinds of light-diffusing material particles 70 can be used. The light-diffusing material particles 70 are preferably uniformly dispersed in the first layer 60 so that a same degree of light-diffusing can be obtained throughout in the first layer 60. For the light-diffusing material particles 70, particles having a refractive index different from that of the first layer 60 can be used at an appropriate concentration. Examples of the light-diffusing material particles 70 include $SiO_2$, $Al_2O_3$, $TiO_2$, and $MgF_2$.

For the first layer 60, a light transmissive resin, for example, can be used, but the composition of the first layer 60 is preferably the same as that of the second layer 80. With this arrangement, the first layer 60 can be prevented from detaching from the second layer 80.

The light transmissive resin preferably has optical transmissivity which allows the light from the light emitting elements 50 to transmit therethrough, and has optical properties resistant against deterioration caused by the light. Examples of such light transmissive resins include an insulating resin composition having optical transmissivity which allows the light from the light emitting element 50 to transmit therethrough, such as a silicone resin composition, a modified silicone resin composition, an epoxy resin composition, a modified epoxy resin composition, an acrylic resin composition. Examples of the light transmissive resins also include a silicone resin, an epoxy resin, a urea resin, a fluororesin and a hybrid resin containing at least one of these resins.

Second Layer 80

The second layer 80 seals the second recess 30'. The degree of sealing is not strictly limited, but for example, the second recess 30' is sealed from the bottom surface of the second recess 30' to the upper plane (an imaginary plane at the elevation of the bottom surface of the first recess 20') defining the second recess 30'.

The second layer 80 contains the fluorescent material particles 90. One or plural kinds of fluorescent material particles 90 can be used. The fluorescent material particles 90 may be dispersed uniformly in the second layer 80, but as in the light emitting device according to an embodiment of the present invention, it is particularly preferable that the fluorescent material particles 90 are contained in the second layer 80 with a downwardly increasing density.

With this arrangement, the fluorescent material particles 90 are disposed at the bottom surface of the second recess 30' and the upper surface of each light emitting element 50. Thus, the portion where the fluorescent material particles 90 are stacked has a uniform thickness, so that regardless of the locations, uniform brightness and color of the light emitted from the second layer 80 can be achieved, which reduces the necessity of diffusing light in the first layer 60. This allows a reduction in the density of the light-diffusing material particles 70 in the first layer 60, which enables to reduce the amount of optical loss. Thus, an improvement in the light extraction efficiency and brightness becomes possible.

The fluorescent material particles 90 are dispersed uniformly in the second layer 80 before conducting a treatment such as curing on the second layer 80, but by using a technique such as spontaneous precipitation or centrifugal sedimentation, the fluorescent material particles 90 can be settled in the second layer 80 at the time of curing the second layer 80. Thus, the fluorescent material particles 90 can be disposed with downwardly higher density in the second layer 80.

In a light emitting device according to an embodiment of the present invention, generation of a depression at the interface of the second recess 30' and the first recess 20' is prevented and the second layer 80 can be formed with a uniform thickness, so that the fluorescent material particles 90 which have been dispersed uniformly in the second layer 80 can be disposed at the bottom surface of the second layer 80 with a uniform thickness, Thus, color unevenness at the light emitting surface can be reduced.

For the second layer 80, for example, a light transmissive resin can be used. The same kinds of light transmissive resin used in the first layer 60 can also be used for the second layer 80, therefore, description of those will be omitted.

For the fluorescent material particles 90, any known fluorescent material particles can be used in view of the emission wavelength of the light emitting elements to be used and the color of light to be obtained. For example, a YAG-based fluorescent material activated with Ce etc., a nitride-based fluorescent material or an oxynitride-based fluorescent material, activated mainly with a lanthanoid element such as Eu or Ce can be used.

The particle size of the fluorescent material particles 90 is not specifically limited, but is preferably 6 μm or greater, more preferably about 10 μm. Further, the size is much more preferably about the range 10 μm to 20 μm. Generally, the larger the particle size of the fluorescent material particles 90, the higher the excitation efficiency and the light emitting efficiency increases. However, with a larger particle size, a bluish tone in the upward direction straight above the light emitting device increases and a yellowish tone in the lateral direction of the light emitting device also increases, which increases color unevenness in distribution of light and thus results in degradation of lighting quality.

For this reason, conventionally, the light emitting efficiency and the quality of lighting are in trade-off relation, and based on this point of view, the particle size of the fluorescent material particles 90 is limited. However, color unevenness in distribution of light can be reduced in the light emitting device according to an embodiment of the present invention, and thus the light emitting efficiency can be further improved than ever before with the use of fluorescent material particles 90 having a larger particle size than ever before while achieving higher lighting quality than ever before or retaining the same level of lighting quality as before.

In the present specification, in order to facilitate understanding of the light emitting device according to an embodiment of the present invention, the explanation of the members other than described above is omitted; however, it is needless to say that a conductive member (for example, a lead frame) for supplying electric current to the light emitting elements 50 and the like can be disposed on the package 10'.

According to a light emitting device according to an embodiment of the present invention as described above, a light emitting device achieving reduction in uneven brightness, uneven color, and uneven light distribution at the light emitting surface and excellent lighting quality even with using a light-concentrating device for condensing light can be provided.

A light emitting device according to an embodiment of the present invention is capable of achieving excellent lighting quality even with using a light-concentrating device for condensing light and above that, has a simplified structure suitable for mass production, and thus can be used suitably for a lighting apparatus for general lighting such as a base light, a spot light, and a down light, and for a lighting apparatus for commercial lighting such as a street light, a road light, a projector, and a billboard lighting.

In the embodiments of the present invention, the first recess 20' and the second recess 30' are defined in the package 10', but the member which defines those recesses is not specifically limited. Thus, the first recess 20' and the second recess 30' may be defined in an electrically conductive member such as a lead frame.

In the present specification, the expression "substantially does not contain" includes a case which does not contain at all, and also includes a case which contains to an extent without departing from the scope of the invention. An example of such a case is, for example, in the case of the first layer 61, when the light-diffusing material particles and the fluorescent material particles with respect to the light transmissive resin are indicated as x (wt %) and y (wt %) respectively, the contents are expressed by the inequality $(y/x) \leq 0.1$. An example of the case where the contents are expressed by $(y/x) \leq 0.1$ is, for example, in the first layer, the ratio of the weights of the light transmissive resin, the light-diffusing material particles, and the fluorescent material particles are expressed by: weight of light transmissive member:weight of light-diffusing material particles:weight of fluorescent material particles=100:10:(1 or less). In the present specification, those fluorescent material particles which have general properties as a fluorescent material but are not excited by the wavelength of the light emitted from the plurality of light emitting elements 50 disposed in the second recess 30' do not serve as a fluorescent material in the context of the embodiments of the present invention. Thus, such fluorescent material particles are omitted from the fluorescent material particles which are substantially not contained in the first layer 60. Such fluorescent material particles are, in the embodiments of the present invention, not the fluorescent material particles that the first layer 60 substantially does not contain, but may be an example of the light-diffusing material particles 70 that are contained in the first layer 60.

In the present specification, the term "disposed in scattering manner" refers to an arrangement with appropriate intervals (which are not necessarily equal intervals) which enables propagation of light to the entire region of the second layer.

In the present specification, the terms such as "uniform", "equal", "same", "identical", and "same level" include a case of perfect matching and also a case of matching to an extent without departing from the scope of the invention.

Example 1

Figure 13:
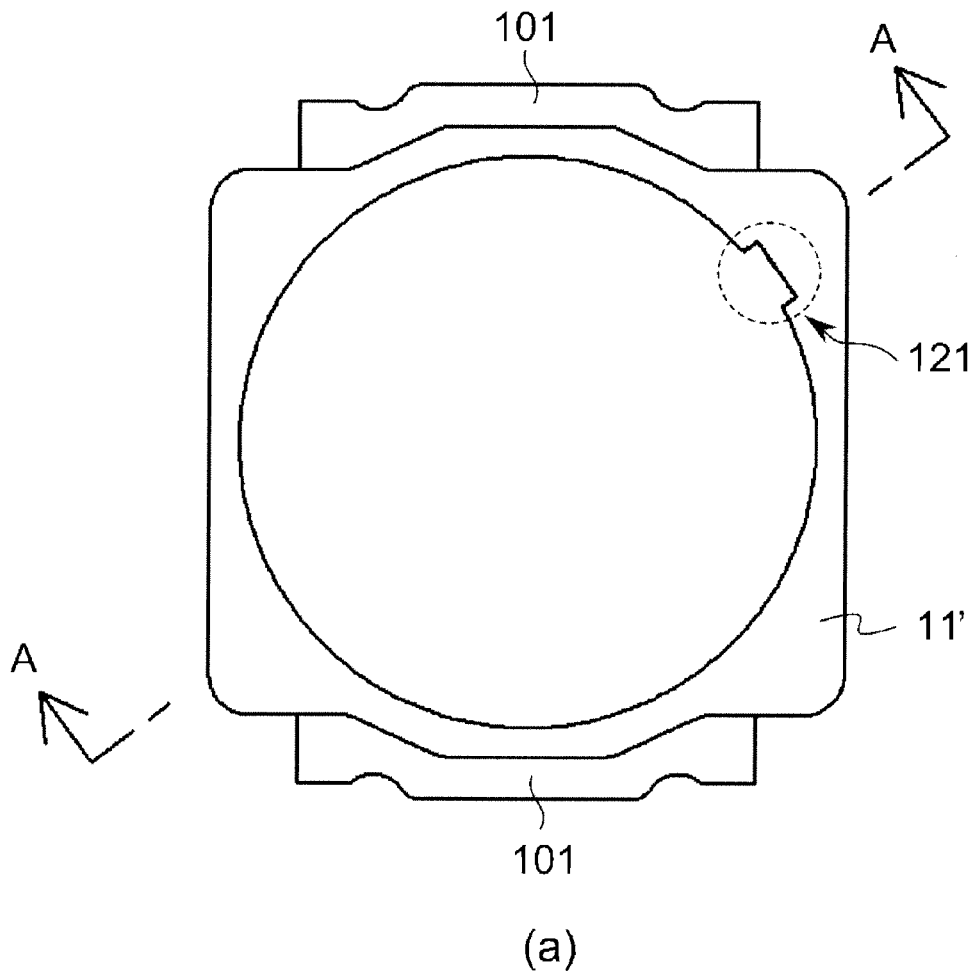
FIGS. 13(a) and 13(b) are diagrams describing a light emitting device according to Example 1 of the present invention.
Figure 13:
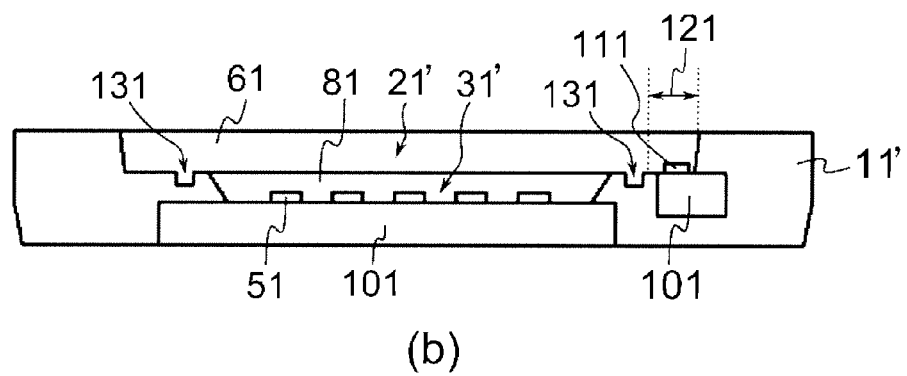

FIGS. 13(*a*) and 13(*b*) are diagrams each illustrating a light emitting device according to Example 1 of the present invention. FIG. 13(*a*) is a schematic plan view showing a light emitting device according to Example 1 of the present invention and FIG. 13(*b*) is a schematic cross sectional view taken along line A-A of FIG. 13(*a*).

As shown in FIGS. 13(*a*) and 13(*b*), a light emitting device according to Example 1 of the present invention includes a first recess 21', a second recess 31' formed in the bottom surface of the first recess 21', a plurality of light emitting elements 51 arranged on the bottom surface of the second recess 31', a first layer 61 containing light-diffusing material particles (not shown) and sealing the first recess 21', and a second layer 81 containing fluorescent material particles (not shown) and sealing the second recess 31', a lead frame 101, and a protective element 111.

In the case of the first layer 61, when the light-diffusing material particles and the fluorescent material particles with respect to the light transmissive resin are indicated as x (wt %) and y (wt %) respectively, the content of the fluorescent material particles is given by y=0. Consequently, the contents are expressed by the inequality $0 \leq (y/x) \leq 0.1$. Thus, the first layer 61 substantially does not contain the fluorescent material particles.

The first recess 21' and the second recess 31' are formed in the package 11'. On the lead frame 101, a plurality of light emitting elements 51 and a protective element 111 are mounted respectively.

For the package 11', a resin material containing a reflective material which has a high optical reflectance (specifically, titanium dioxide) is used. In Example 1 of the present invention, the second recess 31' is formed by using this resin material.

In the first recess 21', a cutout portion 121 is provided. With this arrangement, a region for mounting the protective element 111 can be prepared on the bottom surface of the first recess 21' without consuming excessive area.

Also, a groove-shaped anchor portion 131 is formed in the surface of the first recess 21'. This arrangement enables to prevent the first layer 61 from detaching.

The first recess 21' and the second recess 31' have inclined side surfaces. This arrangement can facilitate guiding of the light reflected at the side surfaces to the upper surface, so that the light extraction efficiency can be improved. The side surfaces of the first recess 21' have inclination angles smaller than that of the side surfaces of the second recess 31'. This arrangement enables a reduction in the area of the light emitting surface (in Example 1 of the present invention, the upper surface of the first recess 21'), which enables to downsize the light emitting device.

In Example 1 of the present invention, a reflective material which has a high optical reflectance (specifically, titanium dioxide) is used for the package 11', so that a reflective member is not necessarily provided on the side surfaces of the first recess 21' and the second recess 31', but a reflective member may be provided thereon.

Although it is not specifically shown in FIGS. 13(*a*) and 13(*b*), the lead frame 101 is disposed from the first recess 21' to the second recess 31' with a bend therebetween. The region in the second recess 31' for mounting the plurality of light emitting elements 51 and the region in the first recess 21' for mounting the protective element 111 are provided on a single lead frame 101.

Example 1 of the present invention illustrates an example in which the second recess 31' is formed in the package 11', but the second recess 31' can be formed in the lead frame 101. In this case, for example, the lead frame 101 is bent to form a recess in the lead frame 101 as the second recess 31', or the thickness of a portion of the lead frame is reduced to form a recess as the second recess 31'.

Example 2

Figure 14:
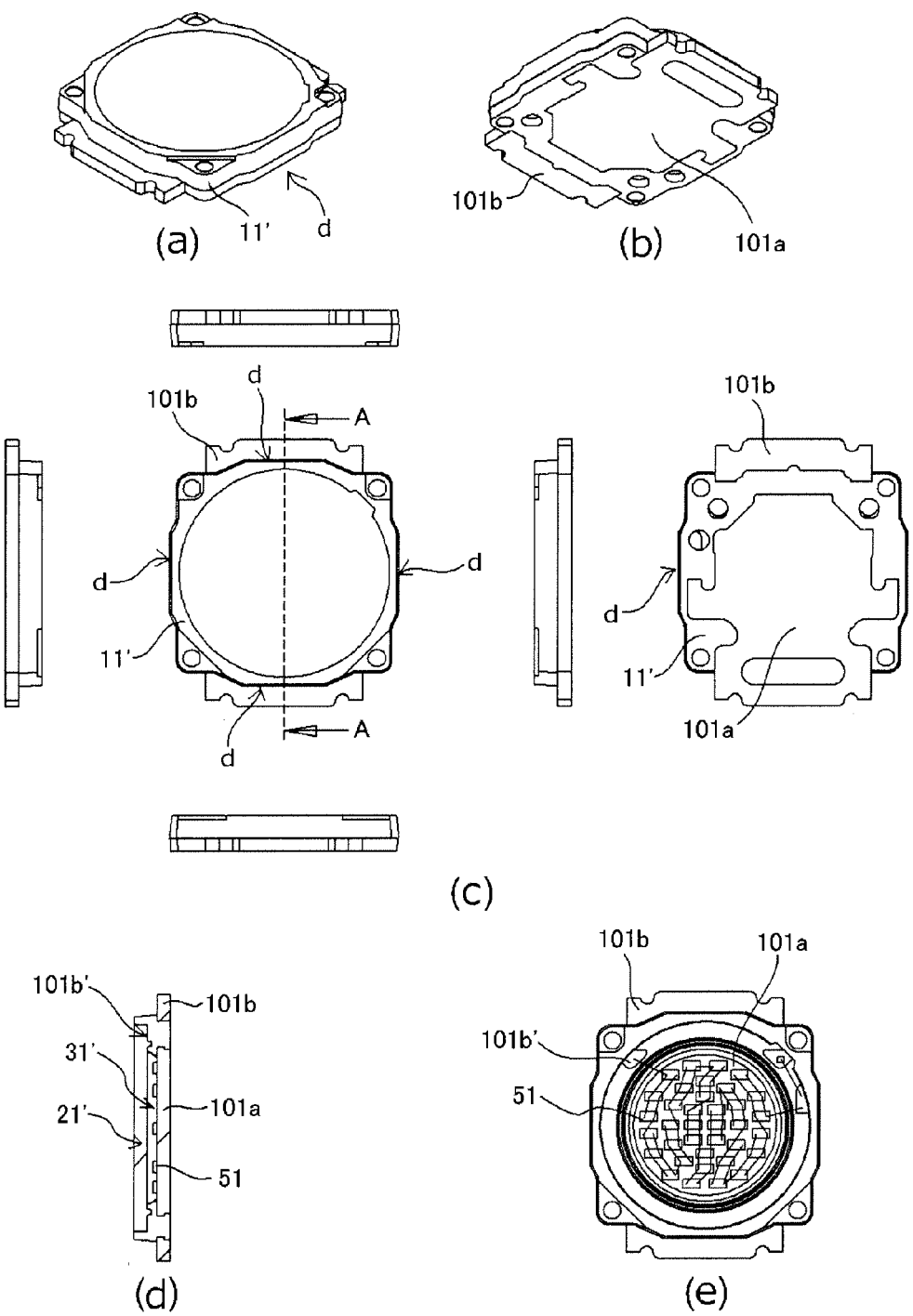
FIGS. 14(a) to 14(e) are diagrams describing a light emitting device according to Example 2 of the present invention.

FIGS. 14(*a*) to 14(*e*) are diagrams describing a light emitting device according to Example 2 of the present invention. FIG. 14(*a*) is a schematic perspective view seen from above, FIG. 14(*b*) is a schematic perspective view seen from below, FIG. 14(*c*) shows six schematic orthographic views, FIG. 14(*d*) is a schematic cross-sectional view taken along line A-A in FIG. 14(c), and FIG. 14(e) is a schematic plan view. Note that, in FIG. 14(e), the sealing member is omitted to show the light emitting elements.

As shown in FIG. 14, in the light emitting device according to Example 2 of the present invention, the lead frame 101a is disposed on the entire bottom surface of the second recess 31'. Accordingly, in the light emitting device according to Example 2 of the present invention, a uniform reflectance can be obtained at the bottom surface of the second recess 31'.

The plurality of light emitting elements 51 are connected to the lead frame 101a disposed at the entire bottom surface of the second recess 31', in such a manner that one of the electrodes of the plurality of light emitting elements 51 is dye-bonded to the lead frame 101a. Also, the plurality of light emitting elements 51 are so connected with each other that the other electrode of each of the plurality of light emitting elements is connected to another light emitting element through a wire. One of the other electrodes of the plurality of light emitting elements 51 is wire-bonded to the lead frame 101b (more specifically, the portion 101b' of the lead frame 101b which is exposed at the bottom surface of the first recess 21').

The package 11' has a protruded portion d protruding in conformity with the shape of the first recess 21'.

In the disclosure above, there is described only the embodiments and examples of the present invention and but a few examples of its versatility. It is to be understood that the present invention is not limited thereto but may be variously embodied to practice within the scope of the present invention.

INDUSTRIAL APPLICABILITY

The present invention can be suitably used for lighting apparatuses for general lighting such as a base light, a spot light, a down light, and for various lighting apparatuses for commercial lighting such as a street light, a road light, a projector, and a billboard lighting device.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a plurality of light emitting elements sealed with a single fluorescent material containing member, each of the plurality of light emitting elements having an upper surface,
wherein the plurality of light emitting elements are arranged such that, in a planar view of a light emitting surface, when the plurality of light emitting elements are projected in any parallel direction in a plane of the light emitting surface, traces of the upper surfaces of the plurality of the light emitting elements merge into a single trace.

2. The light emitting device according to claim 1, wherein, the plurality of light emitting elements are arranged such that, in a planar view of the light emitting surface, when the plurality of the light emitting elements are rotated around a center of the light emitting surface, traces of the upper surfaces of the plurality of the light emitting elements merge to form a single circle centered at the center of the light emitting surface.

3. The light emitting device according to claim 1, wherein, in a planar view of the light emitting surface, the plurality of the light emitting elements are arranged more densely at a center region of the light emitting surface than at a peripheral region of the light emitting surface.

4. The light emitting device according to claim 1, wherein at least some of the plurality of light emitting elements have upper surfaces of different shapes.

5. The light emitting device according to claim 1, wherein at least some of the plurality of light emitting elements have upper surfaces of different sizes.

6. The light emitting device according to claim 1, wherein the light emitting surface has a circular shape, and at least one of the light emitting elements is arranged at an angle along an edge of the light emitting surface having a circular shape.

7. The light emitting device according to claim 1, wherein the light emitting surface has a quadrangular shape.

8. The light emitting device according to claim 1, wherein the plurality of light emitting elements are arranged in a staggered manner.

9. The light emitting device according to claim 1, wherein the plurality of light emitting elements are arranged in a longitudinally asymmetric manner.

10. The light emitting device according to claim 1, wherein the plurality of light emitting elements are arranged in a laterally asymmetric manner.

11. The light emitting device according to claim 1, further comprising:
a first recess; and
a second recess formed in a bottom surface of the first recess,
wherein the plurality of light emitting elements are arranged on a bottom surface of the second recess,
wherein a first layer containing light-diffusing material particles seals the first recess, and
wherein a second layer containing fluorescent material particles seals the second recess.

12. The light emitting device according to claim 11, wherein the first layer substantially does not contain fluorescent material particles.

13. The light emitting device according to claim 11, wherein the fluorescent material particles are contained in the second layer with a downwardly increasing density.

14. The light emitting device according to claim 11, wherein the plurality of light emitting elements are arranged in a scattered manner on the bottom surface of the second recess.

15. The light emitting device according to claim 11, wherein a reflective member is disposed on a side surface of the second recess.

16. The light emitting device according to claim 11, wherein a reflective member is disposed on a side surface of the first recess.

17. The light emitting device according to claim 1, wherein the fluorescent material particles have a particle diameter of 6 μm or greater.

18. The light emitting device according to claim 1, wherein the plurality of light emitting elements are arranged such that, in a planar view of the light emitting surface, when the plurality of the light emitting elements are rotated around a center of the light emitting surface, traces of the upper surfaces of the plurality of the light emitting elements merge to form a single substantially solid and substantially uninterrupted circle centered at the center of the light emitting surface.

19. The light emitting device according to claim 1, wherein the light emitting elements are LED chips.

20. A lighting apparatus comprising:
a light-concentrating device; and
a light emitting device comprising:

a plurality of light emitting elements sealed with a single fluorescent material containing member, each of the plurality of light emitting elements having an upper surface, wherein the plurality of light emitting elements are arranged such that, in a planar view of a light emitting surface, when the plurality of light emitting elements are projected in any parallel direction in a plane of the light emitting surface, traces of the upper surfaces of the plurality of the light emitting elements merge into a single trace, wherein the light emitting device is attached to the light-concentrating device.

21. The lighting apparatus according to claim 20, wherein a center of the light emitting surface is coincident with a focal point of the light-concentrating device.

22. A light emitting device comprising:

a plurality of light emitting elements sealed with a single fluorescent material containing member, each of the plurality of light emitting elements having an upper surface, wherein the plurality of light emitting elements are arranged such that, in a planar view of a light emitting surface, when the plurality of light emitting elements are projected in any parallel direction in a plane of the light emitting surface, traces of the upper surfaces of the plurality of the light emitting elements merge into a single trace, wherein the plurality of light emitting elements are arranged such that, in a planar view of the light emitting surface, when the plurality of the light emitting elements are rotated around a center of the light emitting surface, traces of the upper surfaces of the plurality of the light emitting elements merge to form a single circle centered at the center of the light emitting surface, and wherein, in a planar view of the light emitting surface, the plurality of the light emitting elements are arranged more densely at a center region of the light emitting surface than at a peripheral region of the light emitting surface.

* * * * *